United States Patent [19]

Tamamura

[11] Patent Number: 4,860,227
[45] Date of Patent: Aug. 22, 1989

[54] CIRCUIT FOR MEASURING CHARACTERISTICS OF A DEVICE UNDER TEST

[75] Inventor: Toshio Tamamura, Tokyo, Japan

[73] Assignee: Hewlett-Packard Company, Palo Alto, Calif.

[21] Appl. No.: 824,026

[22] Filed: Jan. 30, 1986

[30] Foreign Application Priority Data

Jan. 31, 1985 [JP] Japan .................. 60-17099
Jan. 31, 1985 [JP] Japan .................. 60-17100

[51] Int. Cl.$^4$ ............................................. G01R 19/00
[52] U.S. Cl. ................................. 364/553; 364/550; 324/57 R; 324/57 N; 324/77 R
[58] Field of Search ............... 324/57 R, 77 R, 57 N; 364/550, 553

[56] References Cited

U.S. PATENT DOCUMENTS

| | | | |
|---|---|---|---|
| 3,818,331 | 6/1974 | Schlosser | 324/57 R |
| 3,818,332 | 6/1974 | Schlosser | 324/57 R |
| 4,118,665 | 10/1978 | Reinhardt | 324/57 R |
| 4,264,859 | 4/1981 | Blaess | 364/553 |
| 4,275,446 | 6/1981 | Blaess | 364/487 |
| 4,409,543 | 10/1983 | Sugihara | 324/57 R |
| 4,409,544 | 10/1983 | Redlich | 324/57 R |
| 4,544,879 | 10/1985 | Maeda et al. | 324/57 R |
| 4,638,248 | 1/1987 | Schweickert | 364/553 |
| 4,641,246 | 2/1987 | Halbert et al. | 364/487 |
| 4,686,628 | 8/1987 | Lee et al. | 364/551 |

*Primary Examiner*—Thomas H. Tarcza
*Assistant Examiner*—David Cain

[57] ABSTRACT

A measurement circuit includes two signal sources, one for generating a test input signal to a DUT and the other for generating a sampling signal. Both sources are coupled to one crystal oscillator and one or both sources may be fractional N oscillators. A phase locked loop stabilizes the sampling signal generated by the fractional N oscillator. The test input signal and the output signal from the DUT are separately mixed with the sampling signal and the resulting sampled signal are converted to digital values by A/D converters and stored in a microprocessor. The stored values can later be compared and analyzed by the microprocessor to determine the characteristics of the DUT.

2 Claims, 3 Drawing Sheets $$A_p = \frac{1}{N} \sqrt{\left\{\sum_{K=1}^{m}\left(\sin p \cdot \frac{2\pi K}{m}\right) \cdot \text{Data } m\right\}^2 + \left\{\sum_{K=1}^{m}\left(\cos p \cdot \frac{2\pi K}{m}\right) \cdot \text{Data } m\right\}^2} \quad (2)$$

CIRCUIT FOR MEASURING CHARACTERISTICS OF A DEVICE UNDER TEST

BACKGROUND OF THE INVENTION

This invention is concerned with the measurement of the characteristics of a device under test (DUT).

Generally the impedance, gain or phase shift or quality of a DUT, for example a resistor, capacitor, amplifier, or a digital to analog converter, can be measured by providing an A.C. test signal input to the DUT and then comparing that input signal with the A.C. output signals from the DUT or analyzing the A.C. output signal of the DUT. For measurement with high frequency test signals, it may be necessary to convert the high frequency output signal from the DUT to a lower intermediate frequency signal using a selected local oscillator signal. In prior art, making accurate high frequency measurements was difficult and required complicated circuits, especially the circuit for generating the desired local oscillator signal.

BRIEF DESCRIPTION OF THE INVENTION

The object of this invention is to provide a circuit for measuring the characteristics of a DUT with high accuracy and with comparatively simple circuit construction.

According to present invention, a measurement circuit includes two signal sources, one for generating the test input signal to the DUT and the other for generating the local oscillator signal. Both signal sources are coupled to one crystal oscillator and one or both signal sources may be fractional N oscillators, such as described in U.S. Pat. No. 3,928,813 entitled "Device For Synthesizing Frequencies ,Which Are Rational Multiples Of A Fundamental Frequency" issued and assigned to Hewlett-Packard Company.

Another object of the invention is to provide improved measurement accuracy by reducing the errors caused by the jitter or phase noise introduced by the fractional N oscillators. The crystal oscillator signal is applied directly to the DUT as the test signal, and the fractional N oscillator which produces the sampling signal is stabilized by a phase locked loop. The test input signal and the output signal from the DUT are separately mixed with the local oscillator signal and the resulting sampled signals are converted to digital values by A/D converters and stored in a microprocessor. Thereafter, the input and output signals of the DUT can be compared and analyzed by the microprocessor to determine the characteristics of the DUT.

BRIEF DESCRIPTION OF THE DRAWINGS

FIG. 3 is a diagram which illustrates the sampling operation of A.C. signals for the measurement circuits shown in FIGS. 1 and 2.

DESCRIPTION OF PREFERRED EMBODIMENT

Figure 1:
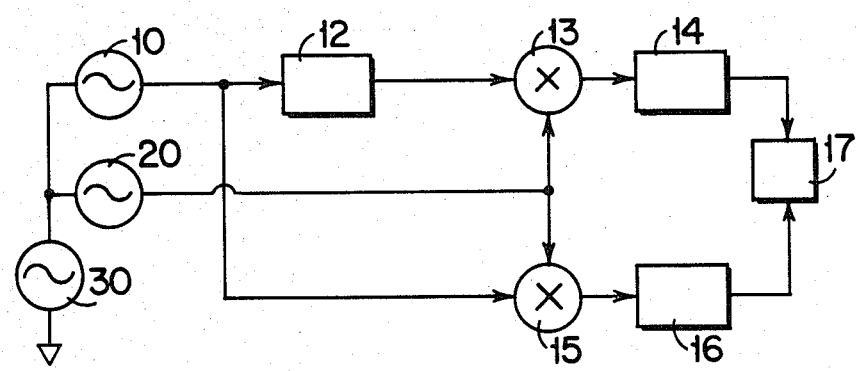
FIG. 1 is a schematic circuit diagram of one embodiment of a measurement circuit constructed in accordance with present invention for measurement of the characteristics of a DUT in response to an A.C. test signal.

FIG. 1 shows a circuit for measuring RF signals applied to and transmitted by a device under test (DUT) 12. First signal source 10 and second signal source 20 are connected to the output of crystal oscillator 30 and provide high accuracy A.C. test signals for use in the circuit. Both signal source 10 and signal source 20 may be fractional N oscillators. Sampler 13 is a mixer whose input channels are connected to the output of DUT 12 and the output of second signal source 20. Sampler 13 samples and holds the instantaneous value of the output signal from DUT 12 under control by the second signal source 20. Sampler 15 is a mixer whose input channels are connected to the input of DUT 12 and the output of second signal source 20. Sampler 15 samples and holds the instantaneous value of the test signal applied to DUT 12 also under control by the second signal source 20. The analog output data from sampler 13 and sampler 15 is converted to digital form by A/D converters 14 and 16 respectively, and the digital data is stored in the memory of microprocessor 17. The desired characteristics of the DUT, for example impedance, resistance and capacitance, can be determined from analysis of the stored instantaneous amplitude values by the microprocessor 17.

Measurement of some characteristics, for example the input to output characteristics of circuits such as an amplifier or a digital to analog converter, can be made using only the output signal from A/D converter 14, and it may not be necessary to use the output signal of A/D converter 16 for these measurements.

The sampling signal is produced by signal source 20 according to equation (1) below, where T is the period of the test signal from source 10 and t is the period of the desired sampling signal.

$$t = nT + T/m \quad (1)$$

Figure 4:
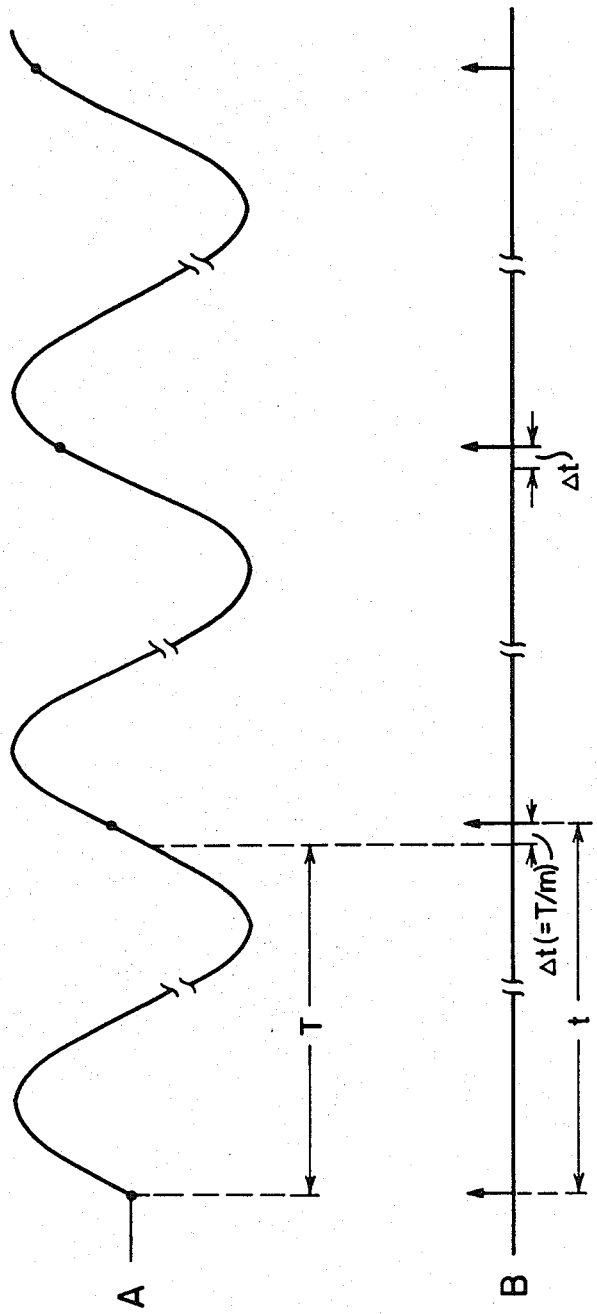
FIG. 4 shows a Digital Fourier Transformation equation which may be used in evaluating the collected data to determine the characteristics of the device under test.

In equation (1) m and n are positive integers with m chosen to represent the number of sampling intervals into which the test signal period is divided. Accordingly, after m data points are measured, the amplitude value Ap for pth harmonic of the test signal can be calculated by applying a Digital Fourier Transformation (DFT), as expressed in equation (2), shown in FIG. 4. Similarly, the amplitude values for higher harmonics may be calculated by expanding the Fourier series. When a two-channel sampler is used, the phase, gain and impedance information available between the channels can also be analyzed.

For example, if the frequency of the test signal is 100 MHz, its period T is 10 nanoseconds. If n is set at 100 and m is set at 128, one data sample is taken every 100 test signal periods with each sampling point offset from the previous sampling point by 1/128 test signal periods, e.g., T/128. The period of the sampling signal t is calculated according to equation (1) as follows:

$$t = 10 \times 100 + 10/128 \text{ ns.}$$

The corresponding sampling signal frequency is 999.92188 ... kHz.

Since fractional N oscillators can produce arbitrary frequencies accurate to one part in 10exp16, oscillator source 20 can easily generate highly accurate sampling signals.

Figure 2:
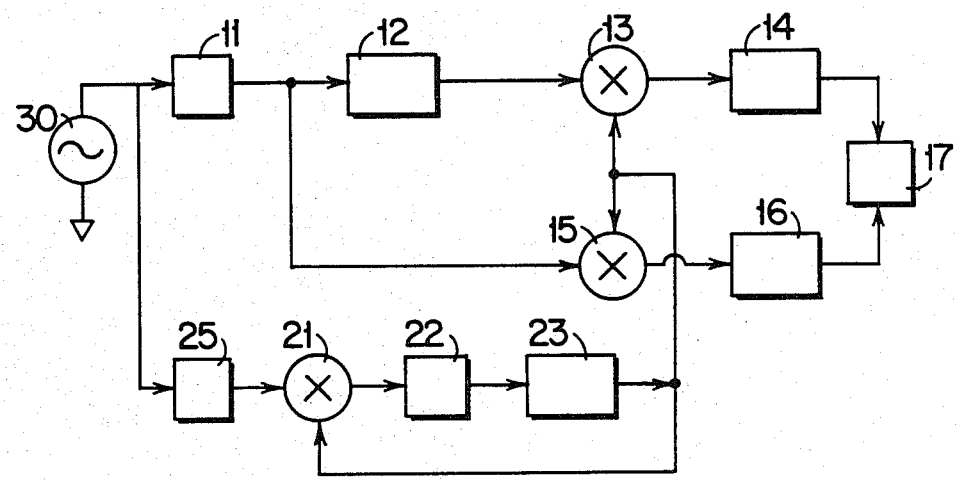
FIG. 2 is a schematic circuit diagram of an alternative embodiment of the invention wherein the local oscillator signal source includes a phase locked loop.

FIG. 2 shows an alternative embodiment of the invention which uses a single fractional N oscillator. If, as in FIG. 1, two fractional N oscillators are used, one for the test signal input and one for the sampling signal, slight measurement errors may be caused by the jitter and phase noise in the fractional N oscillator output signals. The measurement circuit shown in FIG. 2 overcomes this difficulty, while requiring only a single fractional N oscillator to make the measurements of the DUT. The elements in FIG. 2 have the same designation as in FIG. 1 if their function is equivalent. In FIG. 2, the A.C. signal generated by crystal oscillator 30 is used as the test signal, applied to DUT 12 via a filter 11. The output signal from DUT 12 is applied to one input terminal of sampler 13 and the test input signal is applied to one input terminal of sampler 15. The sampling signal is applied to the other input terminal of samplers 13 and 15. The sampling signal, defined by equation (1) above, is generated by fractional N oscillator 25 operating in the phase locked loop described below.

The output signal of crystal oscillator 30 is also applied to fractional N oscillator 25. The output of oscillator 25 is applied to one input terminal of a phase detector 21, which is part of a phase locked loop comprised of phase detector 21, filter 22 and voltage-controlled crystal oscillator 23. The output signal of VCO 23 is applied to the second input terminal of phase detector 21 so the frequency of the VCO 23 is locked to the frequency of fractional N oscillator 25. The stabilized output of the VCO 23 is used as the sampling signal, applied to samplers 13 and 15. Thus, a highly accurate noise free sampling signal for any desired frequency can be produced.

The A.C. signal applied to DUT 12 is generated directly by crystal oscillator 30 which further improves the accuracy of the measurement. The output signal of crystal oscillator 30 may be applied to DUT 12 through a frequency divider if a lower test frequency is needed.

FIG. 3 is a timing chart which illustrates the sampling operation which takes place in the measurement circuits shown in FIGS. 1 and 2. Curve A represents the test input signal to DUT 12 and curve B represents the sampling interval produced by the sampling signal.

With the sampling period $t$ equal to $nT+T/m$, a sequence of sampling points is taken which divides the waveform of signal A into m segments. These data points are converted to digital form by A/D converters 14 and 15 and stored in the memory of microprocessor 17. This sampling operation is performed on both the test signal input to DUT 12 and the output signal from DUT 12. Thereafter the data can be processed to obtain phase and frequency information, for example using equation (2) above. The data from the input and output waves can be compared to determine the gain and phase shift characteristics of the DUT.

For example, if the output frequency of crystal oscillator 30 is 100 MHz (T=10 ns.), to achieve a sampling frequency in the range of 1 MHz, (n=10), with 100 data points over the output wave form (m=100) the sampling frequency to be produced by the fractional N oscillator 25 as determined from equation (1) is 1/1.001 MHz, or 999.00099000990 kHz. To obtain 1000 data points on the output waveform (m=1000), the sampling frequency would be 1/1.0001 MHz or 999.9900000999990 kHz.

In the first case, the pull-in range of oscillator 23 is about 1 kHz, which is an indication of the deviation from the central frequency, 1 MHz, of oscillator 23. In the second case, where n is the same and m is increased to 1000 to increase measurement accuracy, the sampling frequency is 999.9900000999990 kHz, and the pull-in range of oscillator is narrowed to 0.01 kHz. Accordingly, if a large value for m is selected, the number of sampling points for one cycle is increased and the pull-in range of VCO 23 becomes narrower. The narrower the pull-in range becomes, the better the quality of the output signal from oscillator 23 becomes, because jitter is reduced. Therefore the measurement of A.C. signals with higher accuracy may clearly be expected

I claim:

1. Apparatus for measuring the characteristics of a device under test, comprising:

first generating means for generating a periodic test signal with a period of T, based on a crystal oscillator reference signal, applied to the device under test;

second generating means coupled to the reference signal of the first generating means, and comprising a fractional N oscillator, for generating a periodic sampling signal with a period of $t=nY+T/m$, where n and m are integers, and m is the number of sampling intervals into which the test signal period is divided;

first sampling means for receiving the output signal of the device under test and the sampling signal to produce a first signal representing the momentary amplitude values of the output signal;

second sampling means for receiving the input signal to the device under test and the sampling signal to produce a second signal representing the momentary amplitude values of the input signal;

first converting means for converting the first signal to first digital values;

second converting means for converting the second signal to second digital values;

processing means coupled to the first and second converting means for receiving the first and second digital values, and for calculating characteristics of the device under test from the first and second digital values.

2. The apparatus of claim 1 wherein the second generating means comprises a fractional N oscillator and a phase locked loop coupled to the fractional N oscillator for generating the sampling signal as an output of the phase locked loop.

* * * * *

UNITED STATES PATENT AND TRADEMARK OFFICE
CERTIFICATE OF CORRECTION

PATENT NO. : 4,860,227

DATED : Aug. 22, 1989

INVENTOR(S) : Toshio Tamamura

It is certified that error appears in the above-identified patent and that said Letters Patent is hereby corrected as shown below:

Column 1, line 36, "Frequencies ,Which" should read -- Frequencies Which --

Column 4, line 32, "t=nY+T/m" should read -- t=nT+T/m, --

Signed and Sealed this

Fifth Day of February, 1991

Attest:

HARRY F. MANBECK, JR.

Attesting Officer

Commissioner of Patents and Trademarks